(12) United States Patent
Yamane et al.

(10) Patent No.: US 6,784,469 B1
(45) Date of Patent: Aug. 31, 2004

(54) SOLID-STATE IMAGE PICKUP DEVICE AND FABRICATION METHOD THEREOF

(75) Inventors: Junji Yamane, Kanagawa (JP); Kunihiko Hikichi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/455,174

(22) Filed: Dec. 6, 1999

(30) Foreign Application Priority Data

Dec. 8, 1998 (JP) .......................... P10-348876
Nov. 8, 1999 (JP) .......................... P11-317106

(51) Int. Cl.[7] ....................... H01L 27/148; H01L 21/00; H04N 3/14

(52) U.S. Cl. ................... 257/222; 257/223; 257/225; 257/229; 257/232; 257/233; 438/48; 438/60; 438/73; 438/75; 348/294; 348/311; 348/315

(58) Field of Search ...................... 257/222, 223, 257/225, 229, 232, 233, 240, 242, 246, 247, 249, 250; 348/294, 311, 315, 317; 438/48, 60, 73, 75, 78, 588

(56) References Cited

U.S. PATENT DOCUMENTS 5,731,601 A * 3/1998 Shioyama et al. .......... 257/233
5,742,081 A * 4/1998 Furumiya .................... 257/232
5,895,944 A * 4/1999 Yamada ....................... 257/233

* cited by examiner

*Primary Examiner*—Steven Loke
*Assistant Examiner*—Donghee Kang
(74) *Attorney, Agent, or Firm*—Sonnenschein, Nath & Rosenthal LLP

(57) ABSTRACT

A solid-state image pickup device includes: a plurality of light receiving portions arranged in a matrix, and a vertical transfer register which is four-phase driven by first, second, third and fourth transfer electrodes of a three-layer structure. The vertical transfer register is provided for each of columns of said light receiving portions. The first and third transfer electrodes of the first layer are alternately arranged in a charge transfer direction, and the adjacent two of the first and third transfer electrodes extend in parallel to each other between the light receiving portions. With this solid-state image pickup device, the accumulated charge capacity of each transfer region composed of the adjacent transfer electrodes for two-phases is equalized and the area of the light receiving portion is increased irrespective of variations in processed dimension between the transfer electrodes.

4 Claims, 19 Drawing Sheets

F I G. 2A
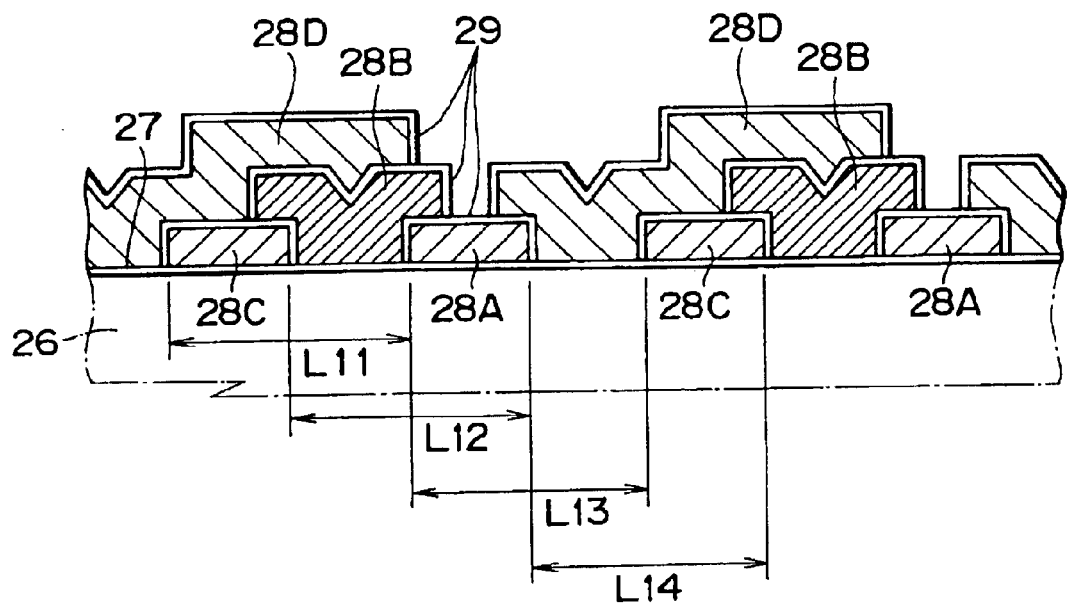
F I G. 2B
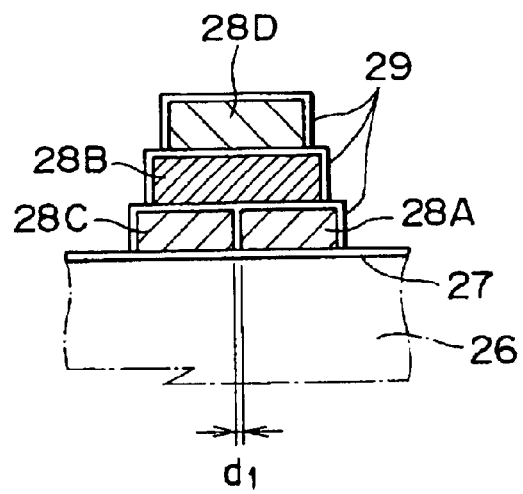

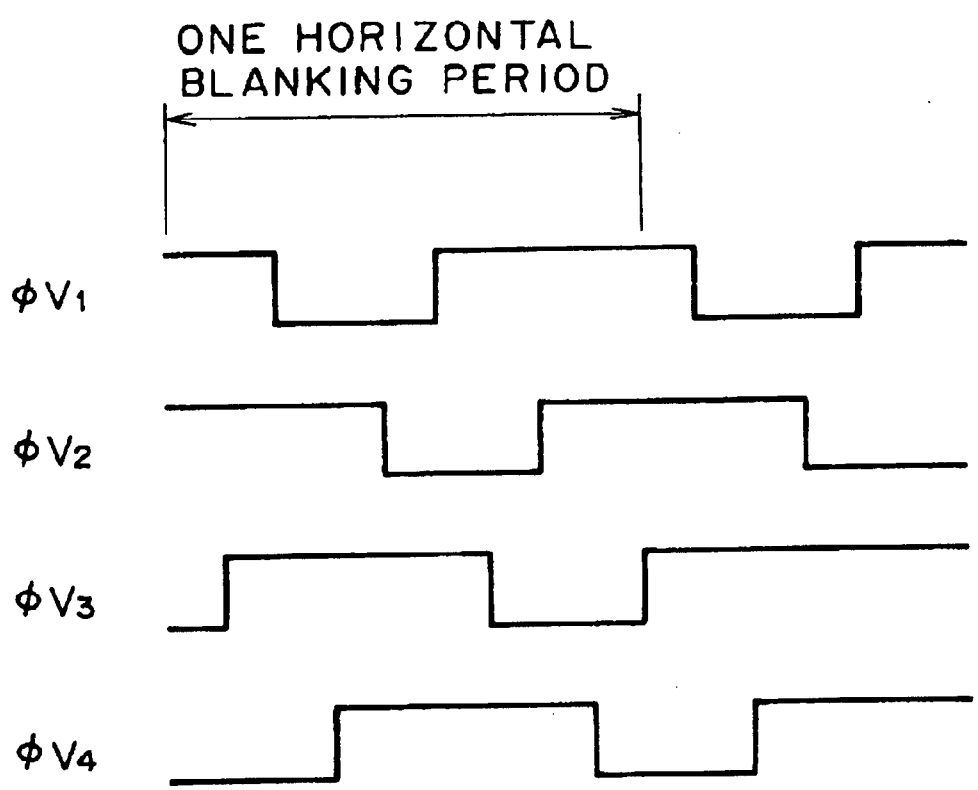

F I G. 11A
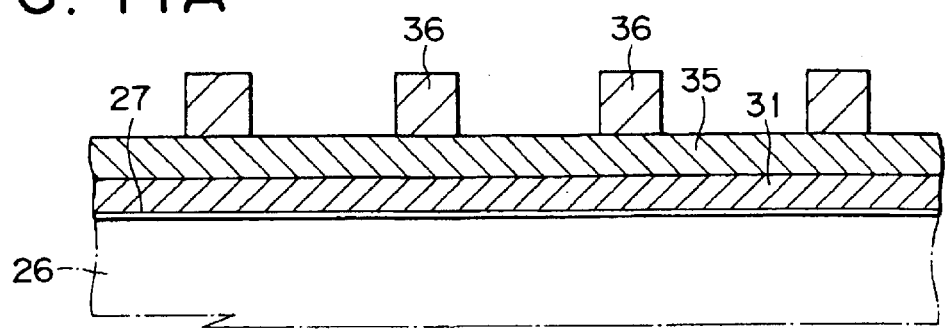
F I G. 11B
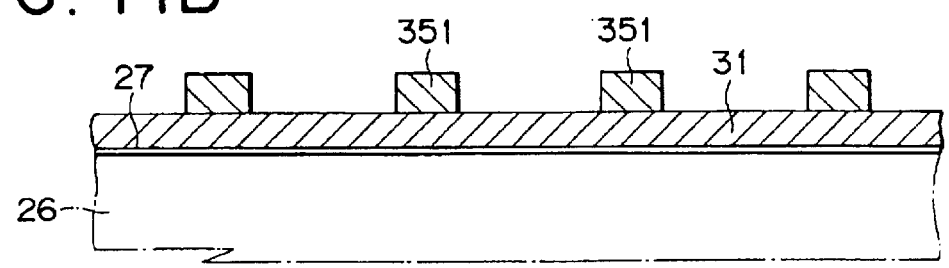
F I G. 11C
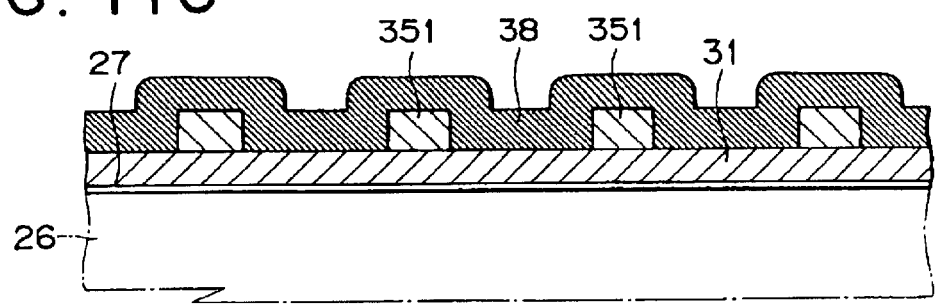
F I G. 11D
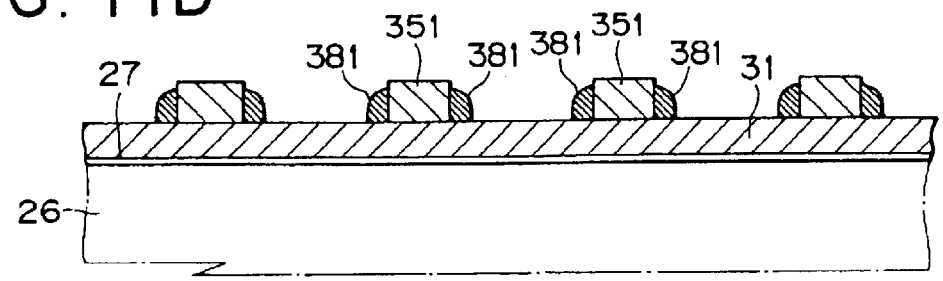

F I G. 12E
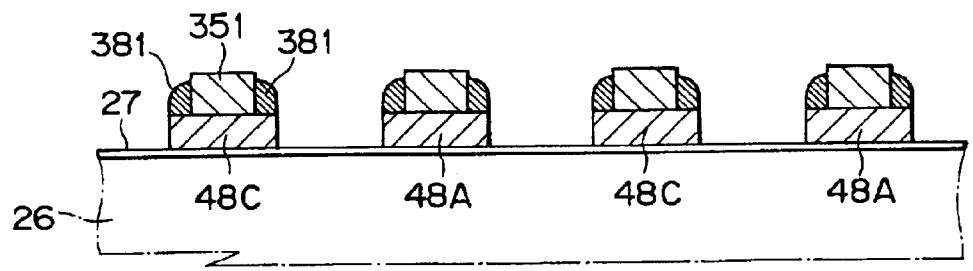
F I G. 12F
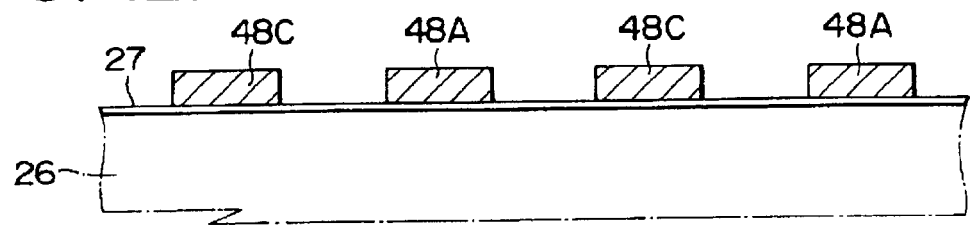
F I G. 12G
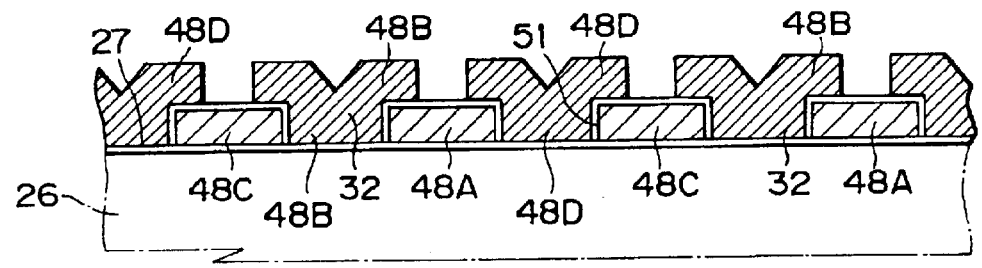
F I G. 12H
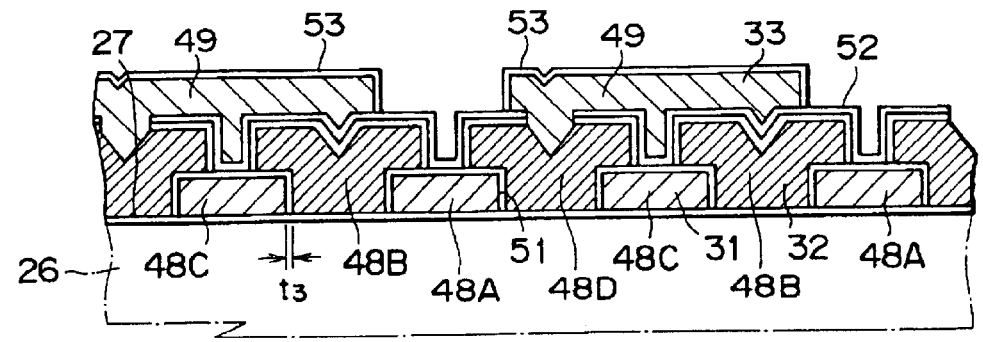

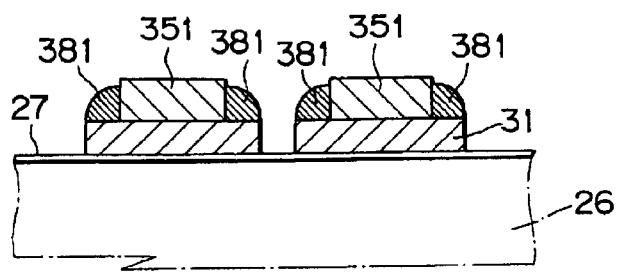
F I G. 14E
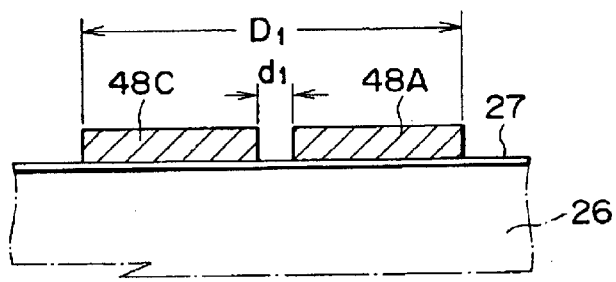
F I G. 14F
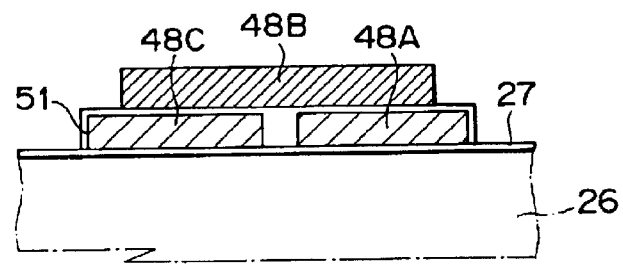
F I G. 14G
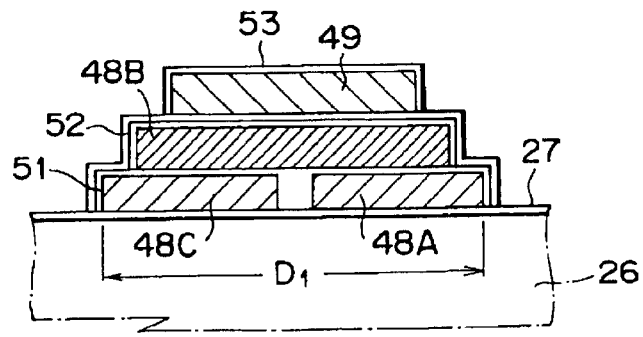
F I G. 14H

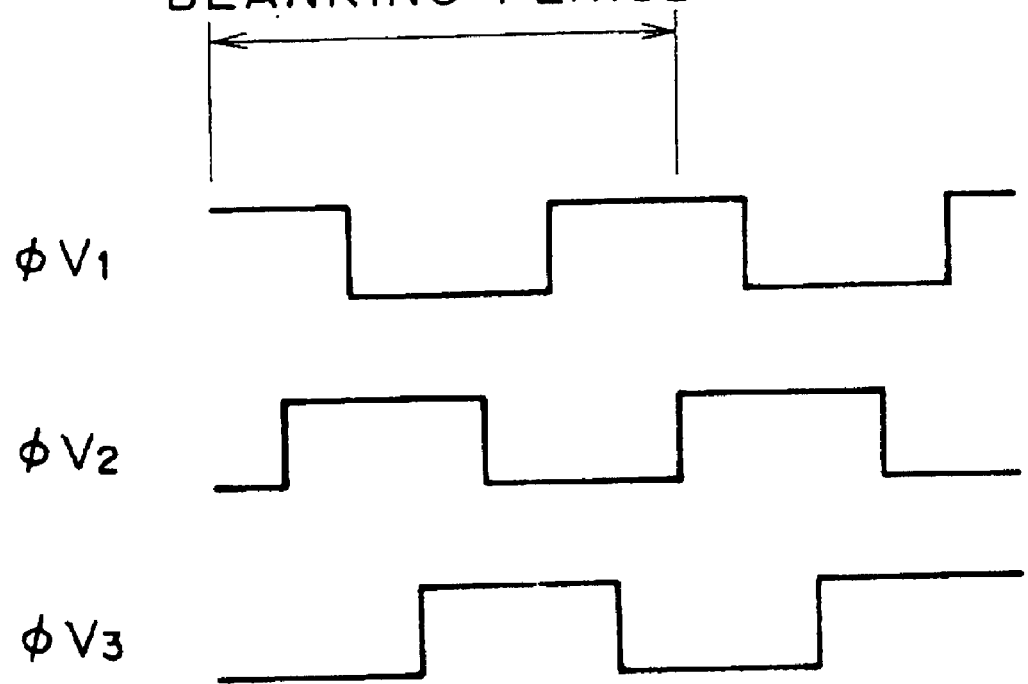

US 6,784,469 B1

SOLID-STATE IMAGE PICKUP DEVICE AND FABRICATION METHOD THEREOF

The present application claims priority to Japanese Application No. P10-348876 filed Dec. 8, 1998 and Japanese Application No. P11-317106 filed Nov. 8, 1999 which applications are incorporated herein by reference to the extent permitted by law.

BACKGROUND OF THE INVENTION

The present invention relates to a solid-state image pickup device suitable for a CCD solid-state image pickup device, typically, of a total pixel readout type, and a fabrication method thereof.

FIG. 17 shows an essential portion of an image pickup region of a conventional total pixel readout type CCD solid-state image pickup device. A CCD solid-state image pickup device 1 shown in FIG. 17, if being of an inter line transfer (IT) type, includes an image pickup region 4 and a horizontal transfer register having a CCD structure (not shown). The image pickup region 4 includes a plurality of light receiving portions 2 for photoelectric conversion, which portions are taken as pixels arranged in a matrix, and a plurality of vertical transfer registers 3 each of which has a CCD structure and which is formed on one side of each column of the light receiving portions 2. The horizontal transfer register is used for transferring signal charges transferred from the vertical transfer registers 3 to an output unit.

FIG. 18A is a sectional view taken on line $A_1$—$A_1$ of FIG. 17, and FIG. 18B is a sectional view taken on line $B_1$—$B_1$ of FIG. 17. Referring to FIGS. 18A and 18B, the vertical transfer register 3 has transfer electrodes having a three-layer structure formed on a transfer channel region of a silicon semiconductor base 6 via a gate insulating film 7. These transfer electrodes are composed of first transfer electrodes 8A formed by a first polysilicon layer, second transfer electrodes 8B formed by a second polysilicon layer, and third transfer electrodes 8C formed by a third polysilicon layer, which are repeatedly arranged along a charge transfer direction "a". Reference numeral 9 designates an interlayer insulating film. Each of the first transfer electrodes 8A is formed into a band-shape extending in the horizontal direction in such a manner as to be common to a plurality of columns of the vertical transfer registers 3. The same is true for the second and third transfer electrodes 8B and 8c.

In the region between the light receiving portions 2 adjacent to each other in the vertical direction, the first, second, and third transfer electrodes 8A, 8B and 8C are sequentially stacked.

The solid-state image pickup device 1 is configured such that the transfer electrode 8 of the vertical transfer register 3 is divided into the three parts, that is, the first, second and third transfer electrodes 8A, 8B and 8C for each pixel (light receiving portion 2), and is three-phase driven for total pixel readout by applying three-phase vertical drive pulses $\phi V_1$, $\phi V_2$, and $\phi V_3$ shown in FIG. 19 to these transfer electrodes 8A, 8B and 8C, respectively.

Another CCD solid-state image pickup device 11 having a configuration shown in FIG. 15 has been proposed. The device 11 is four-phase driven for total pixel readout by applying four-phase vertical drive pulses to transfer electrodes having a three-layer structure of each vertical transfer register.

FIG. 16A is a sectional view taken on line $A_2$—$A_2$ of FIG. 15. Referring to FIGS. 15 and 16A, the CCD solid-state image pickup device 11 is configured such that transfer electrodes 8 of a vertical transfer register 3 are formed by three polysilicon layers. To be more specific, second and fourth transfer electrodes 8B and 8D formed by the second polysilicon layer are alternately arranged along a charge transfer direction; each first transfer electrode 8A formed by the first polysilicon layer is disposed between the second and fourth transfer electrodes 8B and 8D arranged in this order, for example, from the left side in FIG. 16A; and each third transfer electrode 8C formed by the third polysilicon layer is disposed between the fourth and second transfer electrodes 8D and 8B arranged in this order, for example, from the left side in FIG. 16A.

FIG. 16B is a sectional view taken on line $B_2$—$B_2$ of FIG. 15. Referring to FIG. 16B, in the region between the light receiving portions 2 adjacent to each other in the vertical direction, the second and fourth transfer electrodes 8B and 8D formed by the second layer are stacked on the first transfer electrode 8A formed by the first layer, and the third transfer electrode 8C formed by the third layer is stacked on the second and fourth electrodes 8B and 8D.

The solid-state image pickup device 11 is configured such that the transfer electrode 8 of the vertical transfer register 3 is divided into the four parts, that is, the first, second, third, and fourth transfer electrodes 8A, 8B, 8C and 8D for each pixel (light receiving portion 2), and is four-phase driven for total pixel readout by applying four-phase vertical drive pulses $\phi V_1$, $\phi V_2$, $\phi V_3$, and $\phi V_4$, shown in FIG. 3 to these transfer electrodes 8A to 8D, respectively.

The other configuration is the same as that shown in FIG. 17 and FIGS. 18A and 18B, and therefore, corresponding parts are designated by the same characters and the overlapped explanation is omitted.

In the CCD solid-state image pickup device 1 shown in FIG. 17, since the vertical transfer register 3 is three-phase driven by the transfer electrode 8 divided into the three parts, that is, the first, second and third transfer electrodes 8A, 8B and 8C, the accumulated charge capacity in the vertical transfer register 3 is equivalent to one-third of the accumulated charge capacity in the vertical transfer path for one pixel. As a result, to ensure a sufficient accumulated charge capacity in the transfer portion, the width $W_1$ of the transfer path must be broadened; however, if the width $W_1$ of the transfer path is broadened, the area of the light receiving portion 2 is reduced in proportion to the broadened width $W_1$.

The areas of the three transfer electrodes 8A to 8C divided from the transfer electrode 8 for each pixel may be desirable to be equalized to each other for ensuring a larger accumulated charge capacity; however, they actually become uneven largely depending on variations in processed line width among the transfer electrodes 8A to 8C. As a result, the accumulated charge capacity is determined by one of the transfer electrodes 8A to 8C having the smallest area, to thereby reduce the actual charge amount.

In the CCD solid-state image pickup device 11 shown in FIG. 15, which is four-phase driven for total pixel readout by the three-layer electrode structure, since the accumulated charge capacity is equivalent to two-fourth of the accumulated charge capacity in the vertical transfer path for one pixel, it becomes larger than that in the CCD solid-state image pickup device 1 shown in FIG. 17, which is three-phase driven for total pixel readout by the three-layer electrode structure.

The CCD solid-state image pickup device 11, however, has the following disadvantage: namely, a variation in line width occurs between the transfer electrode 8A formed by the first layer and each of the transfer electrodes 8B and 8D formed by the second layer and also a misalignment occurs between the transfer electrode 8A formed by the first layer and each of the transfer electrodes 8B and 8D formed by the second layer, so that variations occur among lengths $L_1$, $L_2$, $L_3$ and $L_4$ of the two-phase transfer regions each of which is composed of the adjacent transfer electrodes for two-phases and is taken as a factor determining the accumulated charge capacity, to thereby reduce the actual charge amount.

SUMMARY OF THE INVENTION

An object of the present invention is to provide a solid-state image pickup device intended to increase the accumulated charge capacity, increase the area of a light receiving portion, and prevent a reduction in actual charge amount due to variations in processed dimension between transfer electrodes, and a method of fabricating the solid-state image pickup device.

To achieve the above object, according to a first aspect of the present invention, there is provided a solid-state image pickup device including: a plurality of light receiving portions arranged in a matrix; and a vertical transfer register which is four-phase driven by transfer electrodes of a three-layer structure, said vertical transfer register being provided for each of columns of said light receiving portions; wherein those, formed by the first layer, of said transfer electrodes are composed of two kinds of transfer electrodes alternately arranged in a charge transfer direction.

With this configuration, of the transfer electrodes of the vertical transfer register which is four-phase driven, the first and third transfer electrodes formed by the first layer are alternately arranged; the second transfer electrodes formed by the second layer are each arranged between the first and third transfer electrodes in such a manner as to be laid across them; and the fourth transfer electrodes formed by the third layer are each arranged between the third and first transfer electrodes in such a manner as to be laid across them. As a result, even if there occur variations in processed dimension between the first and third transfer electrodes of the first layer, the length of the two-phase transfer region composed of the first or third transfer electrode of the first layer and the second transfer electrode of the second layer is usually equalized to the length of the two-phase transfer region composed of the first or third transfer electrode of the first layer and the fourth transfer electrode of the third layer. Accordingly, it is possible to increase the accumulated charge capacity in the vertical transfer register, and hence to prevent the reduction in actual charge amount.

Further, since the vertical transfer register which is four-phase driven is provided, the accumulated charge capacity is equivalent to two-fourth of the accumulated charge capacity in the vertical transfer path per one pixel. This makes it possible to make the width of the vertical transfer path thinner and hence to make the area of the light receiving portion wider.

According to a second aspect of the present invention, there is provided a solid-state image pickup device including: a plurality of light receiving portions arranged in a matrix; and a vertical transfer register which is four-phase driven by first and third transfer electrodes formed by a first layer and second and fourth electrodes formed by a second layer which are alternately arranged in the order of said first, second, third and fourth transfer electrodes, said vertical transfer register being provided for each of columns of said light receiving portions; wherein one of said second and fourth transfer electrodes of the second layer is formed independently for each of said vertical transfer registers; and said one of said second and fourth transfer electrodes, which is formed independently for each of said vertical transfer registers, is connected to an interconnection formed by a third layer.

With this configuration, since the thickness of each interlayer insulating film between the adjacent two of all the transfer electrodes is determined by the thickness of the interlayer insulating film formed on the surfaces of the first and third transfer electrode of the first layer, and therefore, it is equalized and accordingly, it is possible to prevent occurrence of the potential dip upon charge transfer.

With this configuration, of the transfer electrodes of the vertical transfer register which is four-phase driven, the first and third transfer electrodes of the first layer are alternately arranged; and the second and fourth transfer electrodes of the second layer are respectively arranged between the first and third transfer electrodes and between the third and first electrodes of the first layer in such a manner as to be laid across them. As a result, even if there occur variations in processed dimension between the first and third transfer electrodes of the first layer, the length of the two-phase transfer region composed of the first or third transfer electrode of the first layer and the second or fourth transfer electrode of the second layer is usually equalized. Accordingly, it is possible to increase the accumulated charge capacity in the vertical transfer register, and hence to prevent the reduction in actual charge amount.

Further, since the vertical transfer register which is four-phase driven is provided, the accumulated charge capacity is equivalent to two-fourth of the accumulated charge capacity in the vertical transfer path per one pixel. This makes it possible to make the width of the vertical transfer path thinner and hence to make the area of the light receiving portion wider.

According to a third aspect of the present invention, there is provided a method of fabricating a solid-state image pickup device, including the steps of: forming, mask patterns corresponding to patterns of first and third transfer electrodes which are to be alternately arranged in each vertical transfer register formation region and which are to extend in parallel to each other between light receiving portions adjacent to each other in the vertical direction, on a first electrode material layer; forming side walls on each of said mask patterns; patterning said first electrode material layer via said mask patterns having said side walls, to form first and third transfer electrodes formed by the first layer; forming second transfer electrodes by a second electrode material layer via an insulating film in such a manner that each of said second transfer electrodes is disposed between said first and third transfer electrodes of the first layer arranged in this order in said vertical transfer register formation region and between said light receiving portions; and forming fourth transfer electrodes by a third electrode material layer via an insulating film in such a manner that each of said fourth transfer electrodes between said third and first transfer electrodes of the first layer arranged in this order in said vertical transfer register formation region and between said light receiving portions.

With this configuration, since the first and third electrodes formed by the first layer are alternately arranged and then the second electrodes formed by the second layer are each disposed between the first and third electrodes and the fourth electrodes formed by the third layer are each disposed between the third and first electrodes, even if there occur variations in processed dimension between the first and third electrodes of the first layer, it is possible to usually keep the length of each two-phase transfer region composed of the adjacent transfer electrodes for two-phases.

Further, since the first electrode material layer is patterned via the mask patterns having the side walls, the gap between the first and third electrodes of the first layer extending in parallel to each other between the light receiving portions adjacent to each other in the vertical direction is narrower than the minimum line width of the photolithography. Accordingly, it is possible to form the four-phase transfer electrodes having a sufficient width in the narrow region between the light receiving portions.

According to a fourth aspect of the present invention, there is provided a method of fabricating a solid-state image pickup device, including the steps of: forming first and third electrodes by a first electrode material layer in such a manner that said first and third electrodes are alternately arranged in each vertical transfer register formation region and the adjacent two of said first and third electrodes extend in parallel to each other between light receiving portions adjacent to each other in the vertical direction; forming an interlayer insulating film on the surfaces of said first and third transfer electrodes of the first layer; forming second transfer electrodes by a second electrode material layer in such a manner that each of said second transfer electrodes is disposed between said first and third electrodes of the first layer arranged in this order and extends between said light receiving portions; forming fourth transfer electrodes by said second electrode material layer in such a manner that each of said fourth transfer electrodes is disposed between said third and first transfer electrode of the first layer arranged in this order independently only in each of said vertical transfer register formation regions; and forming interconnections by a third conductive material layer in such a manner that each of said interconnections extends between said light receiving portions to be connected to said independent fourth transfer electrode of the second layer.

With this configuration, after the first and second transfer electrodes of the first layer are formed, the interlayer insulating film is formed on the surfaces of the first and second transfer electrodes and then the second and fourth electrodes of the second layer are formed between the first and third transfer electrodes and between the third and first electrodes, and accordingly, each interlayer insulating film between the adjacent two of the all the transfer electrodes is equalized.

Further, since the first and third electrodes formed by the first layer are alternately arranged and then the second electrodes formed by the second layer are each disposed between the first and third electrodes and the fourth electrodes formed by the third layer are each disposed between the third and first electrodes, even if there occur variations in processed dimension between the first and third electrodes of the first layer, it is possible to usually keep the length of each two-phase transfer region composed of the adjacent transfer electrodes for two-phases.

BRIEF DESCRIPTION OF THE DRAWINGS

FIG. 2A is a sectional view taken on line $A_3$—$A_3$ of FIG. 1, and FIG. 2B is a sectional view taken on line $B_3$—$B_3$ of FIG. 1;

FIG. 3 is a timing chart of vertical drive pulses for four-phase drive;

FIGS. 11A to 12H are sectional views, each being equivalent to the cross-section taken on line $A_2$—$A_2$ of FIG. 9, showing another embodiment of a method of fabricating the solid-state image pickup device of the present invention;

FIGS. 13A to 14H are sectional views, each being equivalent to the cross-section taken on line $B_4$—$B_4$ of FIG. 9, showing the embodiment of a method of fabricating the solid-state image pickup device of the present invention;

FIG. 19 is a timing chart of vertical drive pulses for three-phase drive.

DETAILED DESCRIPTION OF THE PREFERRED EMBODIMENT

Hereinafter, embodiments of a solid-state image pickup device and a fabrication method thereof according to the present invention will be described with reference to the drawings.

One embodiment in which the present invention is applied to a total pixel readout type CCD solid-state image pickup device will be described with reference to FIGS. 1 to 3.

Figure 1:
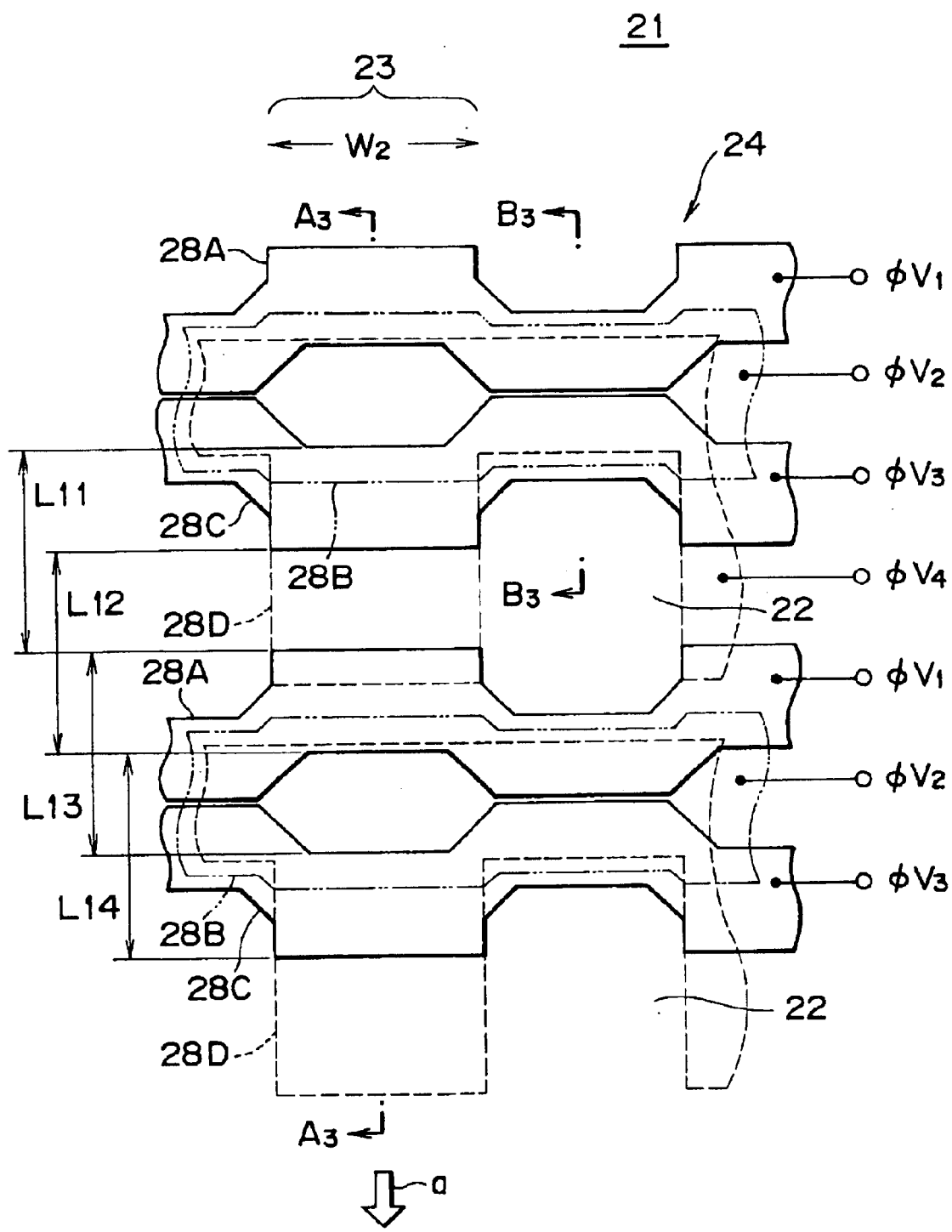
FIG. 1 is a configuration view of an essential portion of an embodiment of a solid-state image pickup device of the present invention.

FIG. 1 shows an essential portion of an image pickup region of a total pixel readout type CCD solid-state image pickup device configured as typically an inter line transfer (IT) type.

A CCD solid-state image pickup device 21 in this embodiment has an image pickup region 34 and a horizontal transfer register of a CCD structure (not shown). The image pickup region 34 has a plurality of light receiving portions 22 for photoelectric conversion, which portions are taken as pixels arranged in a matrix, and a plurality of vertical transfer registers 23 each of which has a CCD structure and is formed on one side of each column of the light receiving portions 22.

FIG. 2A is a sectional view taken on line $A_3$—$A_3$ of FIG. 1 and FIG. 2B is a sectional view taken on line $B_3$—$B_3$ of FIG. 1. Referring to FIGS. 2A and 2B, the vertical transfer register 23 is configured such that transfer electrodes 28 having a three-layer structure are formed on a transfer channel region of a silicon semiconductor base 26 via a gate insulating film 27. To be more specific, first transfer electrodes 28A and third transfer electrodes 28C formed by a first polysilicon layer, second transfer electrodes 28B formed by a second polysilicon layer, and fourth transfer electrodes 28D formed by a third polysilicon layer, are repeatedly arranged along a charge transfer direction "a" (see FIG. 1). The gate insulating film 27 can be formed by a single layer film, or a multi-layer film, typically, a three-layer film having an $SiO_2$ layer, an SiN layer, and an $SiO_2$ layer sequentially stacked (not shown). Reference numeral 29 designates an interlayer insulating film.

Each of the first transfer electrodes 28A is formed into a band shape horizontally extending between the light receiving portions 22 adjacent to each other in the vertical direction in such a manner as to be common to a plurality of columns of the vertical transfer registers 23. The same is true for the second, third and fourth transfer electrodes 28B, 28C and 28D.

In this embodiment, particularly as shown in FIG. 1, the vertical transfer register 23 is formed such that the four transfer electrodes 28A, 28B, 28C and 28D are assigned to one pixel (light receiving portion 22). Of the four transfer electrodes 28, the first and third transfer electrodes 28A and 28C formed by the first polysilicon layer are alternately arranged; the second transfer electrode 28B formed by the second polysilicon layer is disposed between the first and third transfer electrode 28A and 28C arranged in this order, for example, from the right side in FIG. 2A; and the fourth transfer electrode 28D formed by the third polysilicon layer is disposed between the third and first transfer electrode 28C and 28A arranged in this order, for example, from the right side in FIG. 2A.

As shown in FIG. 1 and FIG. 2B, in the region between the light receiving portions 22 adjacent to each other in the vertical direction, the adjacent two transfer electrodes formed by the first polysilicon layer, that is, the first and third transfer electrodes 28A and 28C arranged in this order extend in parallel to each other with a gap $d_1$ put therebetween, and the second and fourth transfer electrodes 28B and 28D are sequentially stacked on the parallel two transfer electrodes 28A and 28C in such a manner as to be laid across the transfer electrodes 28A and 28C.

The solid-state image pickup device 21 is four-phase driven for total pixel readout by applying four-phase vertical drive pulses $øV_1$, $øV_2$, $øV_3$, and $øV_4$ shown in FIG. 3 to the four transfer electrodes 28A, 28B, 28C and 28D assigned to one pixel of each vertical transfer register.

A method of fabricating the CCD solid-state image pickup device 21 in this embodiment, particularly, the formation of the transfer electrodes 28 (28A, 28B, 28C and 28D) of the vertical transfer register 23 will be described with reference to FIGS. 4A to 5H and FIGS. 6A to 7H.

FIGS. 4A to 4D and FIGS. 5E to 5H are each equivalent to the cross-section taken on line $A_3$—$A_3$ passing through the vertical transfer register 23 shown in FIG. 1, and FIGS. 6A to 6D and FIGS. 7E to 7H are each equivalent to the cross-section taken on line $B_3$—$B_3$ passing between the light receiving portions 22 adjacent to each other in the vertical direction shown in FIG. 1.

Figure 4A:
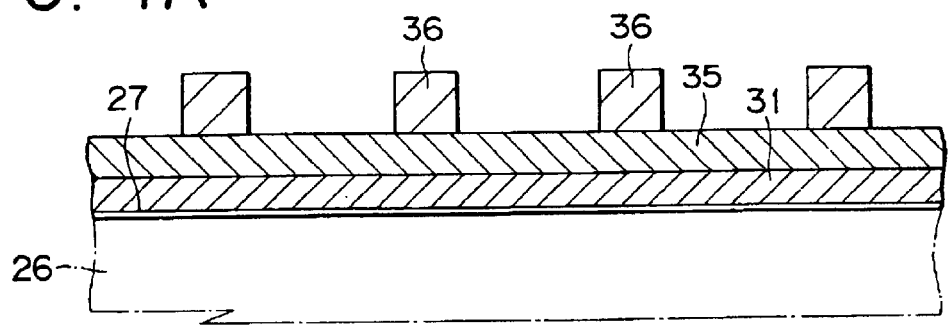
FIGS. 4A to 5H are sectional views, each being equivalent to the cross-section taken on line $A_3$—$A_3$ of FIG. 1, showing one embodiment of a method of fabricating the solid-state image pickup device of the present invention.
Figure 6A:
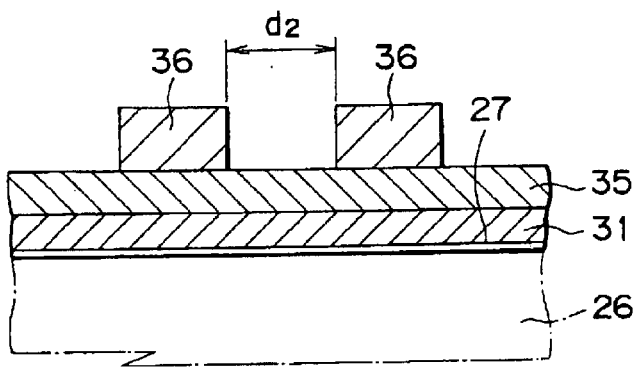
FIGS. 6A to 7H are sectional views, each being equivalent to the cross-section taken on line $B_3$—$B_3$ of FIG. 1, showing the embodiment of a method of fabricating the solid-state image pickup device of the present invention.

First, as shown in FIGS. 4A and 6A, a polysilicon layer 31 as a first electrode material layer is formed over the entire surface of a gate insulating film 27 on the surface, corresponding to an image pickup region, of a silicon semiconductor base 26, and a mask layer 35 made from $SiO_2$ is formed on the polysilicon layer 31 by CVD.

Photoresist patterns 36 are formed on the mask layer 35. The photoresist patterns 36 correspond to patterns of transfer electrodes 28A and 28C which are to be alternately arranged in each vertical transfer register formation region and which are to horizontally extend in parallel to each other in each region between light receiving portions 22 adjacent to each other in the vertical direction.

At this time, a gap $d_2$ between the photoresist patterns 36 in the region between the light receiving portions 22 is set at the minimum line width of the photolithography technique, typically, 0.35 μm.

Figure 4B:
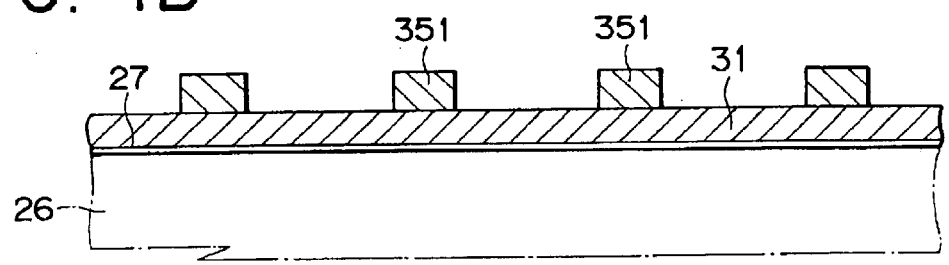
Figure 6B:
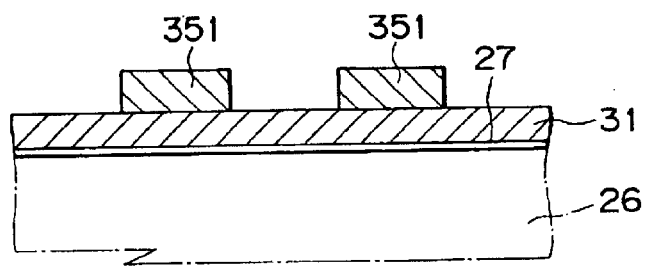

Referring to FIGS. 4B and 6B, the mask layer 35 is selectively etched by anisotropic etching by using the photoresist patterns 36 as a mask, to form mask patterns 351 corresponding to the photoresist patterns, that is, the patterns of the transfer electrodes 28A and 28C to be formed by the first layer.

Figure 4C:
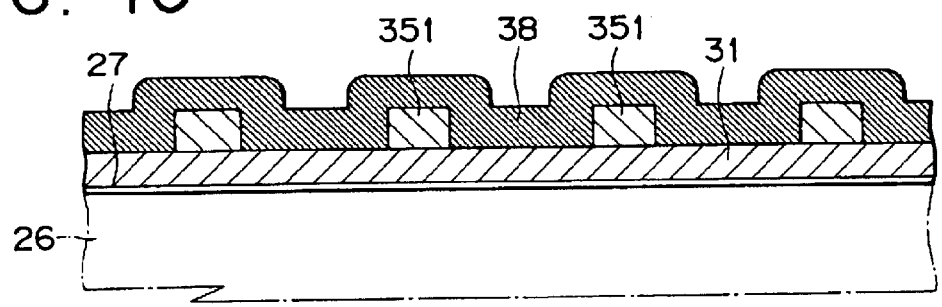
Figure 6C:
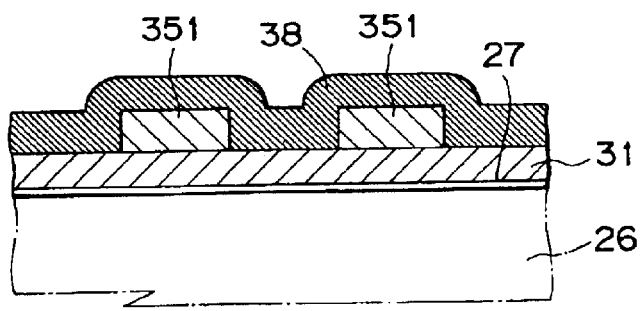

Referring to FIGS. 4C and 6C, after removal of the photoresist patterns 36, an insulating film 38 made from $SiO_2$ is formed over the entire surface including the mask patterns 351 by CVD.

Figure 4D:
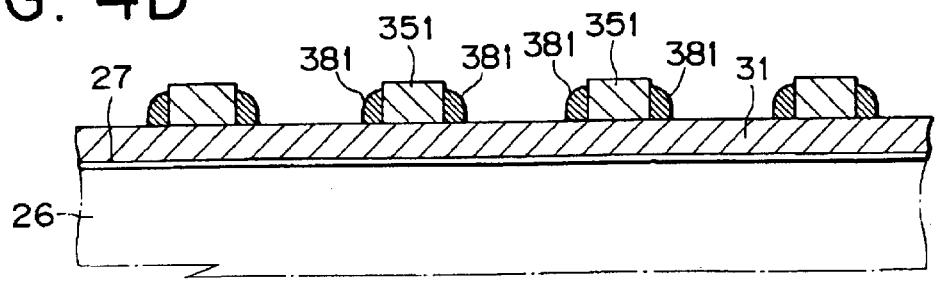
Figure 6D:
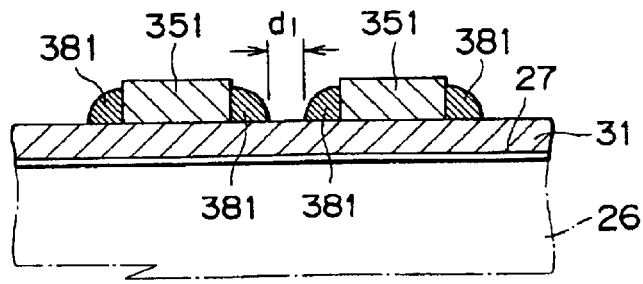

Referring to FIGS. 4D and 6D, the entire surface of the insulating film 38 is anisotropically etched, to form so-called insulating side walls 381 on both sides of each mask pattern 351.

With formation of the side walls 381, a gap between the mask patterns 351 in the region between the light receiving portions 22 becomes a gap $d_1$ narrower than the minimum line width of the photolithography technique, typically, 0.2 μm or less.

Referring to FIGS. 5E and 5F and FIGS. 7E and 7F, the first polysilicon layer 31 is patterned by anisotropic etching via the mask patterns 351 having the side walls 381, to form first and third transfer electrodes 28A and 28C.

Figure 7E:
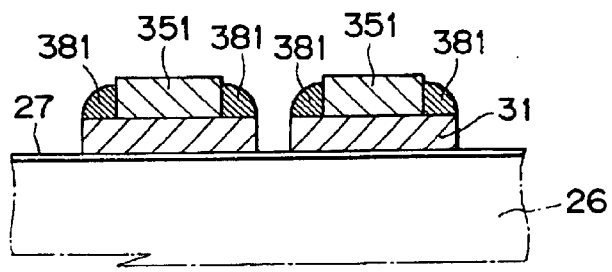
Figure 7F:
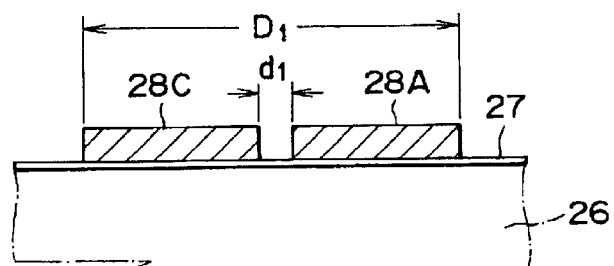

With this patterning, as shown in FIG. 7F, in the region between the light receiving portions 22, the two transfer electrodes 28A and 28C (so-called interconnection portions) extend in parallel to each other with the gap $d_1$ narrower than the minimum line width $d_2$ of the photolithography technique, typically 0.2 μm or less, preferably, 0.1 μm or less put therebetween. The total width $D_1$ of the transfer electrodes 28A and 28C extending in parallel to each other can be made similar to the line width $D_2$ of the transfer electrode 8A formed by the first layer between the light receiving portions 2 shown in FIG. 18B.

Figure 5E:
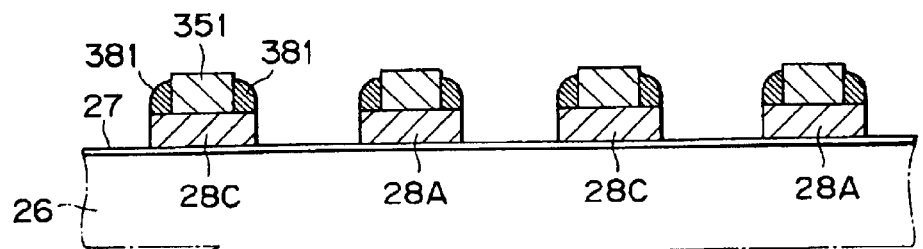
Figure 5F:
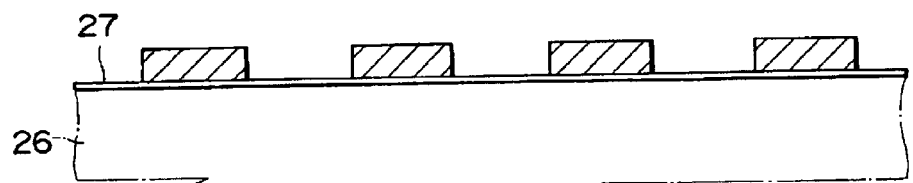

FIGS. 5F and 7F show a state in which the mask patterns 351 and the side walls 381 formed of the $SiO_2$ film by CVD on the transfer electrodes 28A and 28C formed by the polysilicon layer 31 are removed by anisotropic etching. When the $SiO_2$ film by CVD is removed by anisotropic etching, the uppermost $SiO_2$ film of part of the gate insulating film 27 not on the transfer electrodes 28A and 28C is also removed; however, there is no problem because an $SiO_2$ film will be deposited later.

In addition, the mask patterns 351 and the side walls 381 may be left as they are.

Figure 5G:
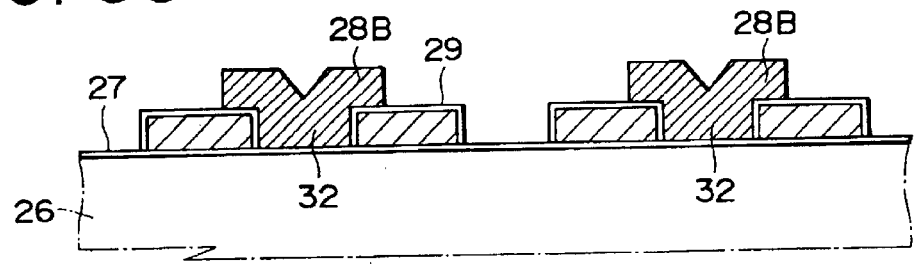
Figure 7G:
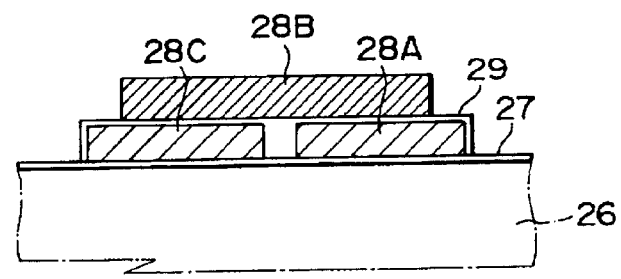

Referring to FIGS. 5G and 7G, a polysilicon layer 32 as a second electrode material layer is deposited via an interlayer insulating film 29 composed of an $SiO_2$ film by CVD and a thermal oxidation film, and is patterned to form, in each vertical transfer register 23 formation region, each second transfer electrode 28B between the transfer electrodes 28A and 28C arranged in this order, for example, from the right side FIG. 5G. As shown in FIG. 7G, in the region between the light receiving portions 22, the second transfer electrode 28B is stacked on the first and third transfer electrodes 28A and 28C.

Figure 5H:
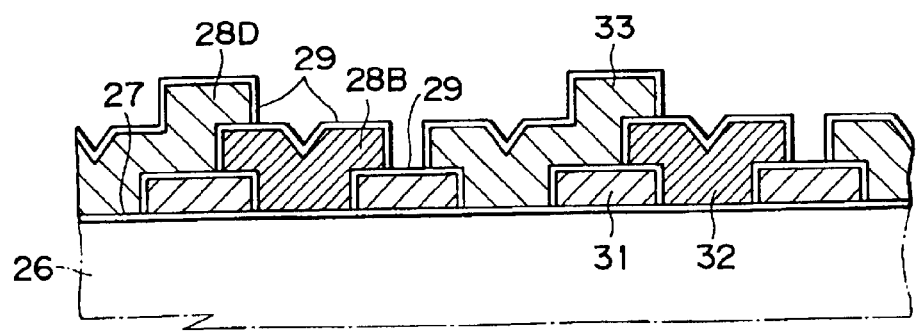
Figure 7H:
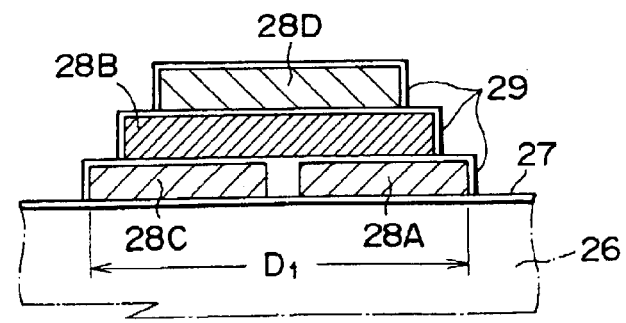

Referring to 5H and 7H, a polysilicon layer 33 as a third electrode material layer is deposited via an interlayer insulating film 29, and is patterned to form, in each vertical transfer register 23 formation region, each fourth transfer electrode 28D between the transfer electrodes 28C and 28A arranged in this order, for example, from the right side in FIG. 5H. As shown in FIG. 7H, in the region between the light receiving portions 22, the fourth transfer electrode 28D is stacked on the second transfer electrode 28B.

In this way, the four transfer electrodes 28A to 28D of the vertical transfer register 23 shown in FIG. 1 and FIGS. 2A and 2B are formed.

Figure 17:
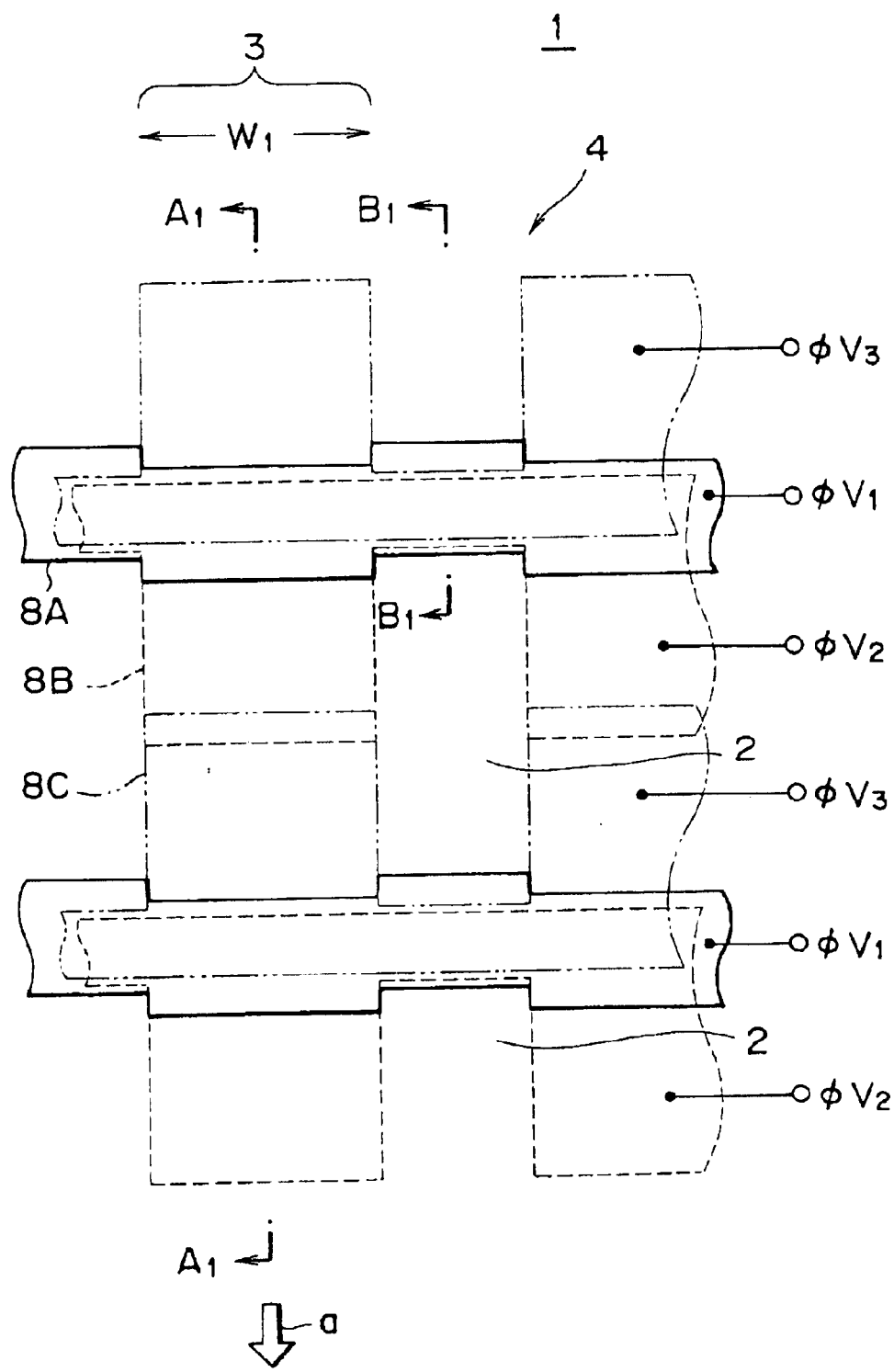
FIG. 17 is a configuration view of an essential portion of another conventional total pixel readout type CCD solid-state image pickup device.

The total pixel readout type CCD solid-state device 21 in this embodiment is configured to perform total pixel readout by the vertical transfer registers 23 which are four-phase driven by the transfer electrodes 28 (28A to 28D) of the three-layer structure. The accumulated charge capacity in the vertical transfer register 23 is thus equivalent to two-fourth of the accumulated charge capacity in the vertical transfer path per one pixel (light receiving portion 22), and therefore, it becomes as large as 1.5 times the accumulated charge capacity of the conventional total pixel readout type CCD solid-state image pickup device 1 which is three-phase driven by the three-layer electrode structure shown in FIG. 17.

Accordingly, to obtain the same accumulated charge capacity as that of the conventional device, the width $W_2$ of the vertical transfer path can be made thinner than that in the conventional device, and the area of the light receiving portion 22 can be correspondingly made wider. This makes it possible to improve the sensitivity and increase the accumulated charge amount in the pixel (light receiving portion).

According to the vertical transfer register 23 in this embodiment, the first and third transfer electrodes 28A and 28C formed by the first polysilicon layer are alternately arranged along the charge transfer direction "a", and the second transfer electrodes 28B formed by the second polysilicon layer and the fourth transfer electrodes 28D formed by the third polysilicon layer are respectively formed between the transfer electrodes 28A and 28C arranged in this order and between the transfer electrodes 28C and 28A arranged in this order. As a result, the sizes of the two-phase transfer regions, each of which is composed of the adjacent transfer electrodes for two-phases and is taken as a factor determining the accumulated charge capacity in the vertical transfer register 23, can be usually equalized to each other irrespective of variations in processed dimension between the transfer electrodes 28A and 28C formed by the first layer. To be more specific, the lengths $L_{11}$, $L_{12}$, $L_{13}$ and $L_{14}$, of the two-phase transfer regions shown in FIG. 1 can be usually equalized to each other ($L_{11}=L_{12}=L_{13}=L_{14}$).

This eliminates an inconvenience that the actual charge amount is reduced depending on the variations in processed dimension between the transfer electrodes 28A and 28C formed by the first layer.

Figure 18A:
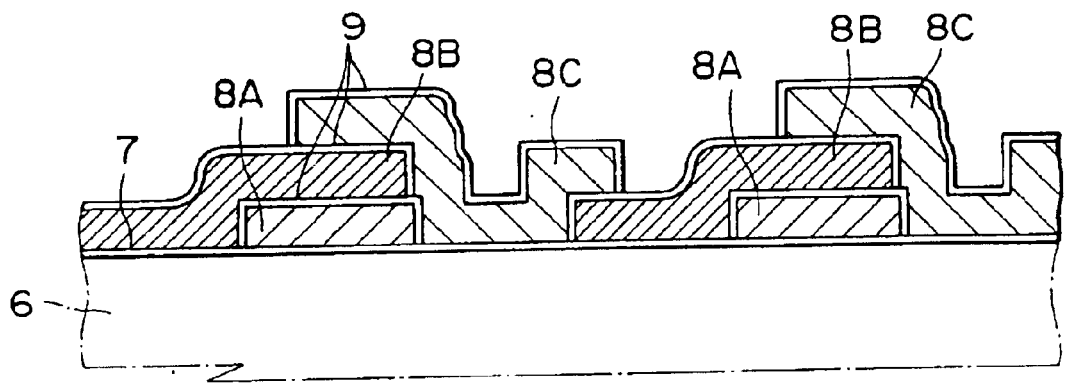
FIG. 18A is a sectional view taken on line $A_1$—$A_1$ of FIG. 17
Figure 18B:
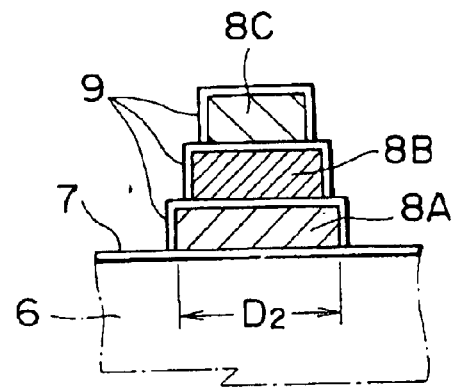
FIG. 18B is a sectional view taken on line $B_1$—$B_1$ of FIG. 17.

In the region between the light receiving portions 22 (pixels) adjacent to each other in the vertical direction, since the transfer electrodes 28A and 28C formed by the first layer extend in parallel to each other and the gap $d_1$ between both the transfer electrodes 28A and 28C is narrower than the minimum line width $d_2$ of the photolithography, the four transfer electrodes 28A to 28D can be formed within the line width $D_1$ nearly equal to the line width $D_2$ required for the conventional transfer electrodes between the pixels shown in FIG. 18B and thereby the area of the light receiving portion 22 can be kept at a large value.

In this embodiment, upon formation of the transfer electrodes 28A and 28C of the first layer, the side walls 381 are formed on the side walls of each mask pattern 351 by the insulating film and the first polysilicon layer 31 is etched via the mask patterns 351 having the side walls 381 to form the first and third transfer electrodes 28A and 28C. Accordingly, in the region between the light receiving portions 22, the gap $d_1$ between the transfer electrodes 28A and 28C formed by the first layer can be made smaller than the minimum line width $d_2$ of the photolithography, typically, 0.2 $\mu$m or less, preferably, 0.1 $\mu$m or less, with a result that the area of the light receiving portion 22 can be kept at a large value as described above.

In the above embodiment, the transfer electrode 28 of the vertical transfer register 23 is divided into four parts for each pixel, and the first transfer electrodes 28A formed by the first layer, the second transfer electrodes 28B formed by the second layer, the third transfer electrodes 28C formed by the first layer, and the fourth transfer electrodes 28D formed by the third layer are repeatedly formed.

Figure 8:
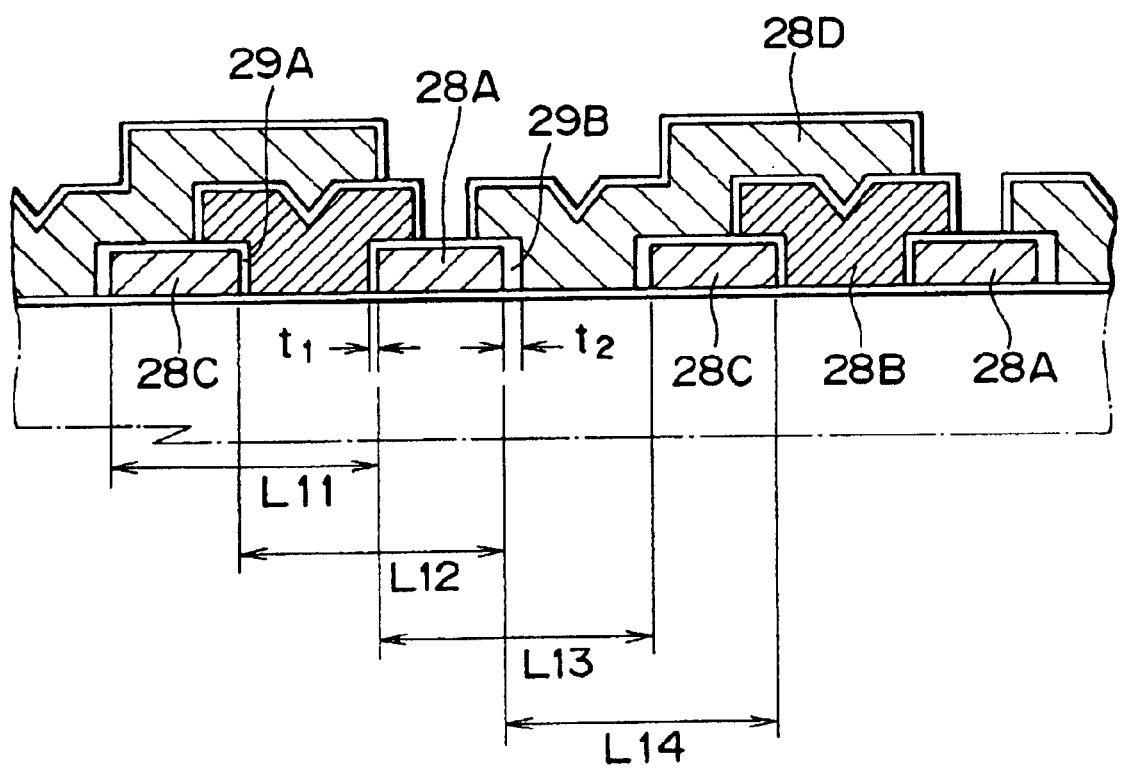
FIG. 8 is a sectional view showing the thickness of an interlayer insulating film of the solid-state image pickup device of the present invention.

At this time, the adjacent two of the transfer electrodes 28 are insulated from each other by the interlayer insulating film 29 composed of the oxide film; however, as shown in FIG. 8, the thickness $t_2$ of an interlayer insulating film 29B between each of the transfer electrodes 28A and 28C formed by the first layer and the transfer electrode 28D formed by the third layer is as large as twice the thickness $t_1$ of an interlayer insulating film 29A between each of the transfer electrodes 28A and 28C formed by the first layer and the transfer electrode 28B formed by the second layer.

The reason for this is that the interlayer insulating film formed after patterning of the transfer electrode 28B formed by the second layer is added to the interlayer insulating film formed after patterning of the transfer electrodes 28A and 28C formed by the first layer.

As a result of occurrence of the thick interlayer insulating film 29B, upon charge transfer, the potential dip is easy to occur under the thick interlayer insulating film 29B, to thereby degrade the transfer efficiency.

A further improved embodiment of the present invention will be described below with reference to FIG. 9 and FIGS. 10A and 10B.

In this embodiment, the present invention is applied, like the previous embodiment, to a CCD solid-state image pickup device configured as an inter line transfer (IT) type which is driven for total pixel readout by a four-phase drive method.

Figure 9:
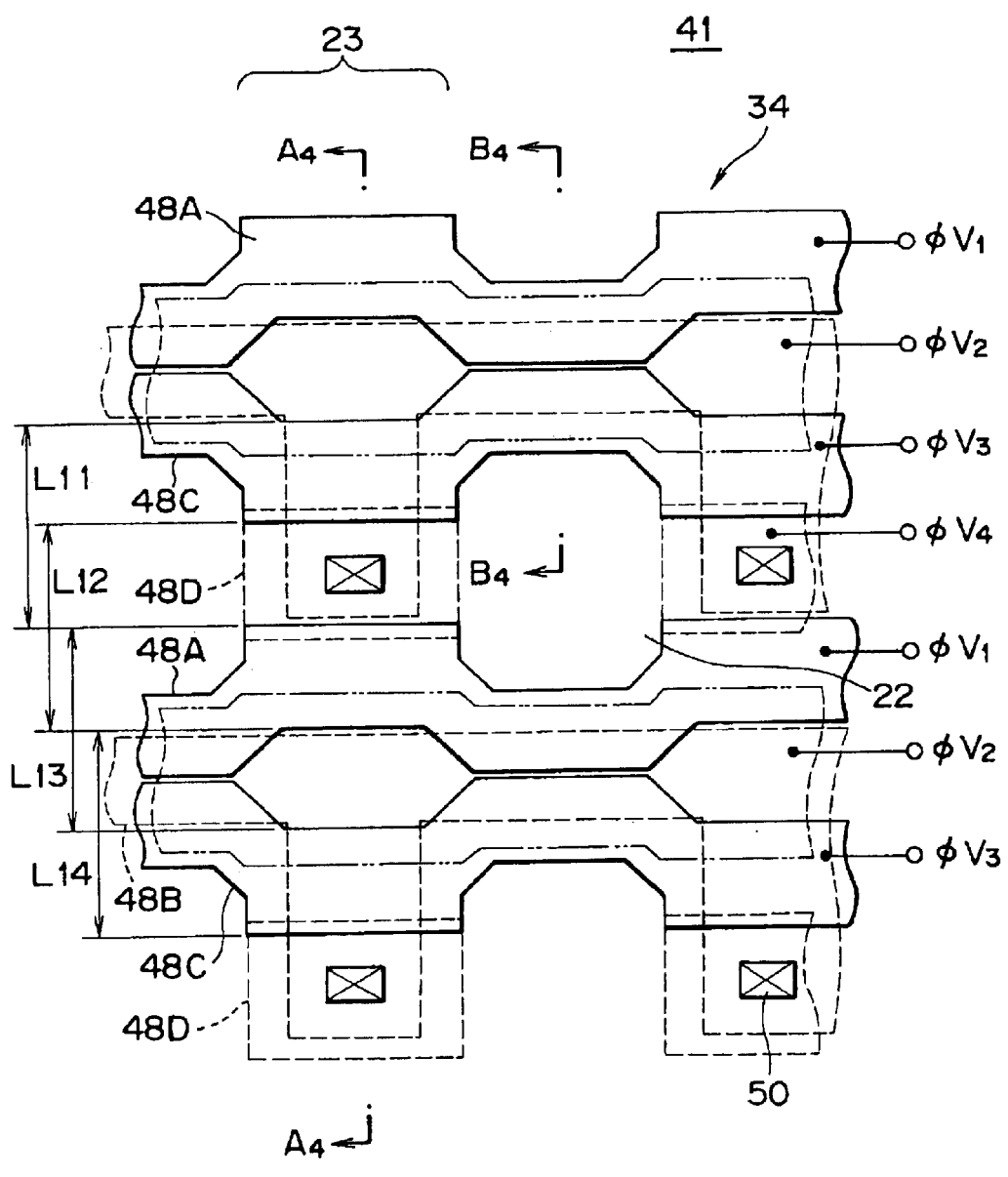
FIG. 9 is a configuration view of an essential portion of another embodiment of a solid-state image pickup device of the present invention.
Figure 10A:
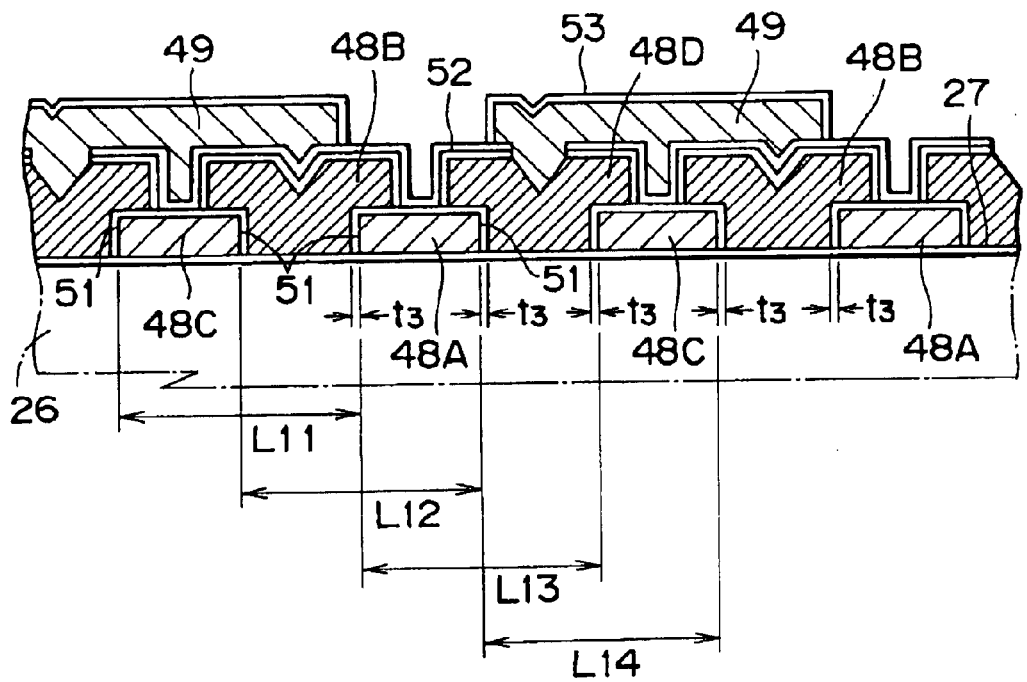
FIG. 10A is a sectional view taken on line $A_4$—$A_4$ of FIG. 9
Figure 10B:
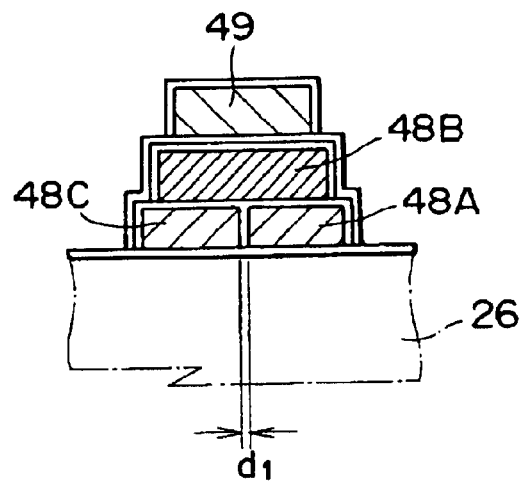
FIG. 10B is a sectional view taken on line $B_4$—$B_4$ of FIG. 9.

FIG. 9 is a view showing an essential portion of an image pickup region of the CCD solid-state image pickup device; and FIG. 10A is a sectional view taken on line $A_4$—$A_4$ taken on line of FIG. 9 and FIG. 10B is a sectional view taken on line $B_4$—$B_4$ of FIG. 9.

A CCD solid-state image pickup device 41 in this embodiment has an image pickup region 34 and a horizontal transfer register of a CCD structure (not shown). The image pickup region 34 includes a plurality of light receiving portions 22 for photoelectric conversion, which portions are taken as pixels arranged in a matrix, and a plurality of vertical transfer registers 23 each of which has a CCD structure and is formed on one side of each column of the light receiving portions 22. The horizontal transfer register is used for transferring signal charges transferred from the vertical transfer registers 23 to an output unit.

Referring to FIGS. 10A and 10B, the vertical transfer register 23 is configured such that transfer electrodes 48 formed by a first layer and a second layer are alternately arranged on a transfer channel of a silicon semiconductor base 26 via a gate insulating film 27. To be more specific, first transfer electrodes 48A formed by a first polysilicon layer, second transfer electrodes 48B formed by a second polysilicon layer, third transfer electrodes 48C formed by the first polysilicon layer, and fourth transfer electrodes 48D formed by the second polysilicon layer are repeatedly arranged along a charge transfer direction "a" (see FIG. 9).

In this embodiment, particularly shown in FIG. 9, the vertical transfer register 23 is formed such that the four transfer electrodes 48A, 48B, 4BC and 48D are assigned to one pixel (light receiving portion 2). Of the four transfer electrodes 48, the first, second and third transfer electrodes 48A, 48B and 48C are each formed into a band-shape horizontally extends between the light receiving portions 22 adjacent to each other in the vertical direction in such a manner as to be common to a plurality of columns of the vertical transfer registers 23; and the fourth transfer electrode 48D is formed independently for each vertical transfer register 23.

Referring to FIGS. 9 and 10B, in the region between the light receiving portions 22 adjacent to each other in the vertical direction, the alternately arranged first and third transfer electrodes 48A and 48C formed by the first polysilicon layer are formed in such a manner as to extend in parallel to each other with a gap $d_1$ put therebetween.

The second and fourth transfer electrodes 48B and 48D formed by the second polysilicon layer are formed in such a manner as to be buried between the transfer electrodes 48A and 48C formed by the first layer. In this case, one of the transfer electrodes formed by the second layer, for example, the second transfer electrode 48B is laid across the two transfer electrodes 48A and 4BC extending in parallel to each between the light receiving portions 22 adjacent to each other in the vertical direction, and the other of the transfer electrodes formed by the second layer, for example, the fourth transfer electrode 48D is independently formed into an island shape for each vertical transfer register 23.

Each independent fourth transfer electrode 48D is connected to the associated one of interconnections (so-called shunt interconnections) 49. Each interconnection 49 is formed by a third polysilicon layer into a band-shape horizontally extending between the light receiving portions 2 adjacent to each other in the vertical direction in such a manner as to be common to a plurality of columns of the vertical transfer registers 23. In FIG. 9, reference numeral 50 designates a contact portion of the independent fourth transfer electrode 48D with the interconnection 49. Referring to FIG. 10B, in the region between the light receiving portions 22 adjacent to each other in the vertical direction, the interconnection 49 is disposed on the second electrode 48B formed by the second layer.

The thickness of each interlayer insulating film formed between the adjacent two of the first, second, third and fourth transfer electrodes 48A, 48B, 48C and 48D arranged in the charge transfer direction is determined only by the thickness of the oxide film as the insulating film 51 formed on the surfaces of the first and third transfer electrodes 48A and 48C of the first polysilicon layer.

Like the previous embodiment, the solid-state image pickup device 41 is four-phase driven for total pixel readout by applying the four-phase vertical drive pulses $øV_1$, $øV_2$, $øV_3$, and $øV_4$ shown in FIG. 3 to the four transfer electrodes 48A, 48B, 48C and 48D assigned to one pixel of the vertical transfer register 23.

Next, a method of fabricating the CCD solid-state image pickup device 41 in this embodiment, particularly, the formation of the transfer electrodes 48 (48A, 48B, 48C and 48D) and the interconnections 49 in the vertical do transfer registers 23 will be described with reference to FIGS. 11A to 12H and FIGS. 13A to 14H.

FIGS. 11A to 11D and FIGS. 12E and 12H are each equivalent to the cross-sections taken on line $A_4$—$A_4$ passing through the vertical transfer register 23 in FIG. 9, and FIGS. 13A to 13D and FIGS. 14E to 14H are each equivalent to the cross-sections taken on line $B_4$—$B_4$ passing between the light receiving portions 22 adjacent to each other in the vertical direction in FIG. 9.

Figure 13A:
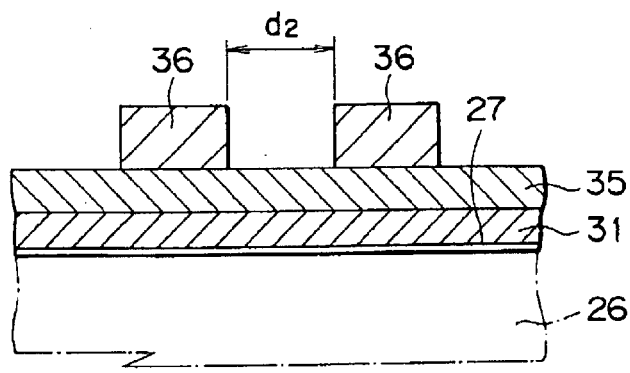

The steps from that shown in FIGS. 11A and 13A to that shown in FIGS. 12F and 14F are the same as the above-described steps from that shown in FIGS. 4A and 6A to that shown in FIGS. 5F and 7F in the previous embodiment.

Referring to FIGS. 11A and 13A, a polysilicon layer 31 as the first electrode material layer is deposited over the entire surface of a gate insulating film 27 formed on the surface, corresponding to an image pickup region, of a silicon semiconductor base 26. A mask layer 35 made from $SiO_2$ is formed on the polysilicon layer 31 by CVD.

Photoresist patterns 36 are formed on the mask layer 35. The photoresist patterns 36 correspond to patterns of transfer electrodes 48A and 48C which are to be alternately arranged in each vertical transfer register formation region and which are to horizontally extend in parallel to each other in each region between light receiving portions 22 adjacent to each other in the vertical direction.

At this time, a gap $d_2$ between the photoresist patterns 36 in the region between the light receiving portions 22 is set at the minimum line width of the photolithography technique, typically, 0.35 µm.

Figure 13B:
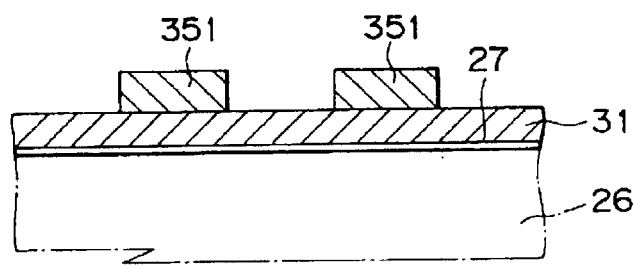

Referring to FIGS. 11B and 13B, the mask layer 35 is selectively etched by anisotropic etching by using the photoresist patterns 36 as a mask, to form mask patterns 351 corresponding to the photoresist patterns, that is, the patterns of the transfer electrodes 48A and 48C to be formed by the first layer.

Figure 13C:
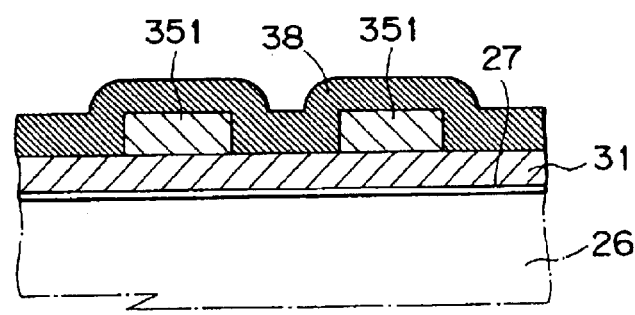

Referring to FIGS. 11C and 13C, after removal of the photoresist patterns 36, an insulating film 38 made from $SiO_2$ is formed over the entire surface including the mask patterns 351 by CVD.

Figure 13D:
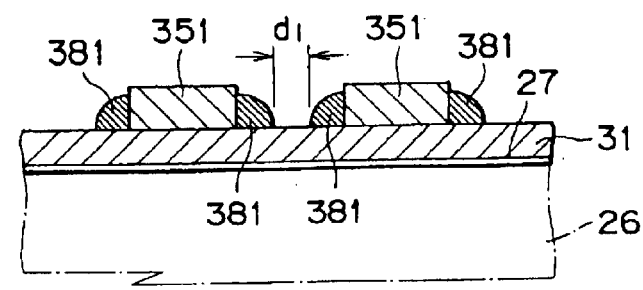
Figure 15:
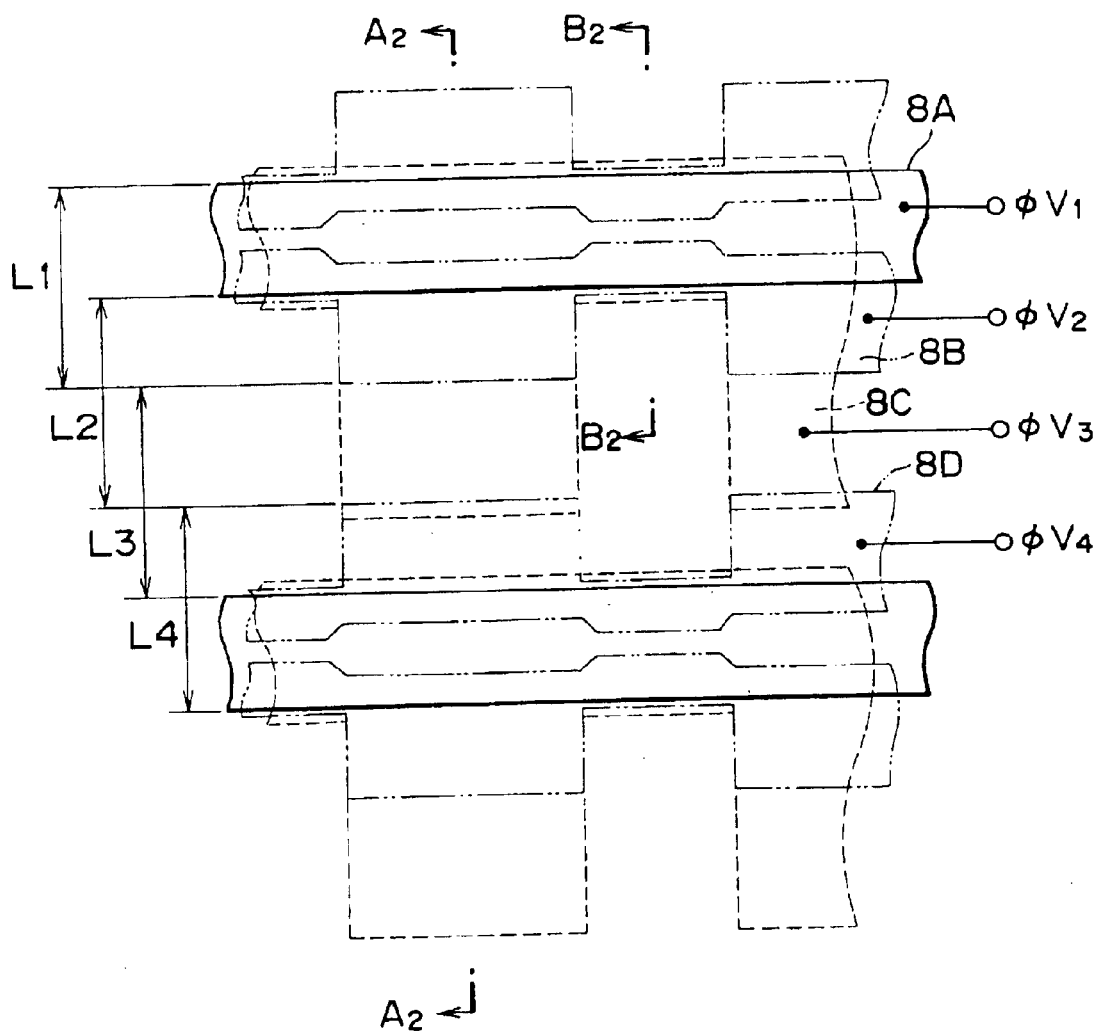
FIG. 15 is a configuration view of an essential portion of a conventional total pixel readout type CCD solid-state image pickup device.
Figure 16A:
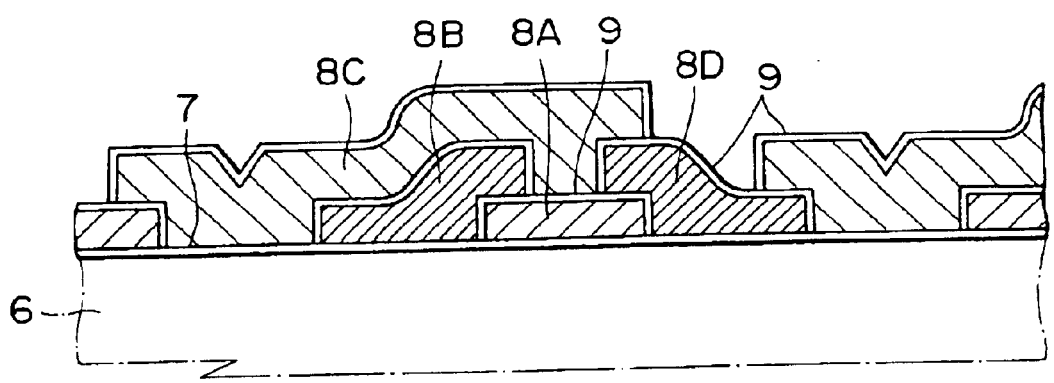
FIG. 16A is a sectional view taken on line $A_2$—$A_2$ of FIG. 15
Figure 16B:
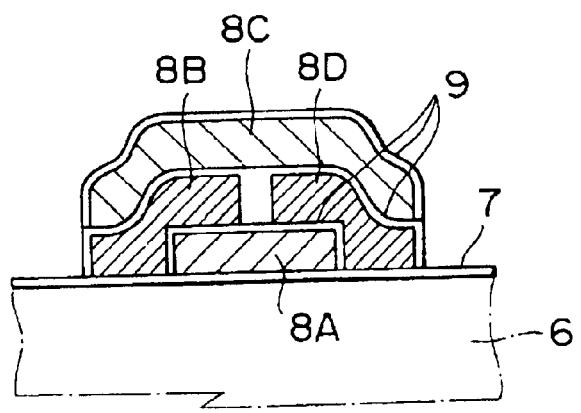
FIG. 16B is a sectional view taken on line $B_2$—$B_2$ of FIG. 15.

Referring to FIGS. 11D and 13D, the entire surface of the insulating film 38 is anisotropically etched, to form so-called insulating side walls 381 on both sides of each mask pattern 351.

With formation of the side walls 381, a gap between the mask patterns 351 in the region between the light receiving portions 22 becomes a gap $d_1$ narrower than the minimum line width of the photolithography technique, typically, 0.2 µm or less.

Referring to FIGS. 12E and 12F and FIGS. 14E and 14F, the first polysilicon layer 31 is patterned by anisotropic etching via the mask patterns 351 having the side walls 381, to form first and third transfer electrodes 48A and 48C.

With this patterning, as shown in FIG. 14F, in the region between the light receiving portions 22, the two transfer electrodes 48A and 48C (so-called interconnection portions) extend in parallel to each other with the gap $d_1$ narrower than the minimum line width $d_2$ of the photolithography technique, typically 0.2 µm or less, preferably, 0.1 µm or less put therebetween. The total width $D_1$ of the transfer electrodes 4BA and 48C extending in parallel to each other can be made similar to the line width $D_2$ of the transfer electrode 8A formed by the first layer between the light receiving portions 2 shown in FIG. 18B.

Referring to FIGS. 12G and 14G, an interlayer insulating film 51 composed of an $SiO_2$ film by CVD and a thermal oxidation film is formed on the surfaces of the transfer electrodes 48A and 48C formed by the first polysilicon layer.

A polysilicon layer 32 as a second electrode material layer is deposited on the interlayer insulating film 51, and is patterned to form, in the formation region of the vertical transfer register 23, each second transfer electrode 48B between the transfer electrodes 48A and 48c arranged in this order, for example, from the right side in FIG. 12G and each fourth transfer electrode 48D between the transfer electrodes 48C and 48A arranged in this order, for example, from the right side in FIG. 12G.

The second transfer electrode 48B extends between the light receiving portions 22 adjacent to each other in the vertical direction in such a manner as to be laid across the first and third transfer electrodes 48A and 48C; while each fourth transfer electrode 48D is independently formed into an island-shape only in each vertical transfer register formation region. With this configuration, the thickness of each interlayer insulating film between the adjacent two of all the transfer electrodes 48 (48A to 48D) can be determined only by the thickness $t_3$ of the oxide film as the interlayer insulating film 51 formed on the surfaces of the transfer electrodes 48A and 48C formed by the first layer.

Next, an interlayer insulating film 52 composed of an $SiO_2$ film by CVD and a thermal oxidation film is formed on the transfer electrodes 48B and 48D formed by the second layer. In this case, the thickness of the $SiO_2$ film by CVD is set to be larger than that of the thermal oxidation film for improving the withstand voltage. Then, part of the interlayer insulating film 52 positioned on each fourth transfer electrode 48D independently formed into the island-shape is selectively removed by etching, and a polysilicon layer as a third conductive material layer is formed over the entire surface.

Referring to FIGS. 12H and 14H, the third polysilicon layer 33 is patterned by selective etching, to form interconnections (so-called shunt interconnection) 49 formed by the third polysilicon layer 33. The interconnection 49, which passes between the light receiving portions 22 adjacent to each other in the vertical direction, is commonly connected via contact portions 50 to the transfer electrodes 48D independently formed in respective vertical transfer registers separately from each other in the horizontal line. As shown in FIG. 14H, in the region between the light receiving portions 22, the interconnection 49 is formed on the second transfer electrode 48B. Reference numeral 53 designates an insulating film such as an oxide film formed on the interconnection 49.

According to the total pixel readout type CCD solid-state image pickup device 41 in this embodiment, all the transfer electrodes 48 (48A, 48B, 48C, 48D) are formed by the electrodes of the first polysilicon layer and the electrodes of the second polysilicon layer which are repeatedly arranged, and the thickness of each interlayer insulating film between the adjacent two of all the transfer electrodes 48 is determined only by the thickness $t_3$ of the oxide film-as the interlayer insulating film 51 on the transfer electrodes 48A and 48C formed by the first polysilicon layer, and therefore, it is equalized.

Further, in this embodiment, an effect similar to that obtained by the CCD solid-state image pickup device 21 in the previous embodiment can be obtained.

The fourth transfer electrodes 48D independently formed in the vertical transfer registers 23 separately from each other in the horizontal direction are commonly connected to each interconnection 49, so that a vertical drive pulse $øV_4$ can be applied to each fourth transfer electrode 48D through the interconnection 49.

The total pixel readout type CCD solid-state device 41 in this embodiment is configured to perform total pixel readout by the vertical transfer registers 23 which are four-phase driven by the transfer electrodes 48 (48A to 48D) of the two-layer structure. The accumulated charge capacity in the vertical transfer register 23 is thus equivalent to two-fourth of the accumulated charge capacity in the vertical transfer path per one pixel (light receiving portion 22), and therefore, it becomes as large as 1.5 times the accumulated charge capacity of the conventional total pixel readout type CCD solid-state image pickup device 1 which is three-phase driven by the three-layer electrode structure shown in FIG. 17.

Accordingly, to obtain the same accumulated charge capacity as that of the conventional device, the Width $w_2$ of the vertical transfer path can be made thinner than that in the conventional device, and the area of the light receiving portion 22 can be correspondingly made wider. This makes it possible to improve the sensitivity and increase the accumulated charge amount in the pixel (light receiving portion).

According to this embodiment, the first and second transfer electrodes 48A and 48C formed by the first polysilicon layer are alternately arranged along the charge transfer direction "a", and the second and fourth transfer electrodes 48B and 48D formed by the second polysilicon layer are each alternately formed between the transfer electrodes 48A and 48C. As a result, the sizes of the two-phase transfer regions, each of which is composed of the adjacent transfer electrodes for two-phases and is taken as a factor determining the accumulated charge capacity in the vertical transfer register 23, can be usually equalized to each other irrespective of variations in processed dimension between the transfer electrodes 48A and 48C formed by the first layer. To be more specific, the lengths $L_{11}$, $L_{12}$, $L_{13}$, and $L_{14}$ of the two-phase transfer regions shown in FIG. 9 can be usually equalized to each other ($L_{11}=L_{12}=L_{13}=L_{14}$).

This eliminates an inconvenience that the actual charge amount is reduced depending on the variations in processed dimension between the transfer electrodes 48A and 48C formed by the first layer.

Since the transfer electrodes 48A and 48C formed by the first layer extend in parallel to each other in the region between the light receiving portions 22 (pixels) adjacent to each other in the vertical direction and the gap $d_1$ between both the transfer electrodes 48A and 48C is narrower than the minimum line width $d_2$ of the photolithography, the four transfer electrodes 48A to 48D can be formed within the line width $D_1$ nearly equal to the line width $D_2$ required for the conventional transfer electrodes between the pixels shown in FIG. 18B and thereby the area of the light receiving portion 22 can be kept at a large value.

In this embodiment, upon formation of the transfer electrodes 48A and 48C of the first layer, the side walls 381 are formed on the side walls of each mask pattern 351 by the insulating film and the first polysilicon layer 31 is etched via the mask patterns 351 having the side walls 381 to form the first and third transfer electrodes 48A and 48C. Accordingly, in the region between the light receiving portions 22, the gap $d_1$ between the transfer electrodes 48A and 48C formed by the first layer can be made smaller than the minimum line width $d_2$ of the photolithography, typically, 0.2 μm or less, preferably, 0.1 μm or less, with a result that the area of the light receiving portion 22 can be kept at a large value as described above.

While the CCD solid-state image pickup device of the present invention is suitable for a total pixel readout type CCD solid-state image pickup device, typically, used for a digital still camera, it can be also applied to a CCD solid-state image pickup device of a frame readout type or field readout type.

Further, the CCD solid-state image pickup device of the present invention can be applied to an inter line transfer type or frame inter line transfer type CCD solid-state image pickup device.

While the preferred embodiments of the present invention have been described using the specific terms, such description is for illustrative purposes only, and it is to be understood that changes and variations may be made without departing from the spirit or scope of the following claims.

What is claimed is:

1. A solid-state image pickup device comprising:

a plurality of light receiving portions arranged in a matrix; and a vertical transfer register which is four-phase driven by transfer electrodes of a three-layer structure, said vertical transfer register being provided for each of columns of said light receiving portions;

wherein said three layer structure is comprised of a first layer, a second layer formed on said first layer, and a third layer formed on said second layer; and wherein those, formed by the first layer, of said transfer electrodes are composed of two kinds of transfer electrodes alternately arranged in a charge transfer direction.

2. A solid-state image pickup device according to claim 1, wherein the adjacent two of said two kinds of transfer electrodes formed by the first layer in such a manner as to be alternately arranged extend in parallel to each other between said light receiving portions adjacent to each other in the vertical direction.

3. A solid-state image pickup device comprising:

plurality of light receiving portions arranged in a matrix; and a vertical transfer register which is four-phase driven by first and third transfer electrodes formed by a first layer and second and fourth electrodes formed by a second layer which are alternately arranged in the order of said first, second, third and fourth transfer electrodes, said vertical transfer register being provided for each of columns of said light receiving portions;

wherein one of said second and fourth transfer electrodes of the second layer is formed independently for each of said vertical transfer registers;

wherein said one of said second and fourth transfer electrodes, which is formed independently for each of said vertical transfer registers, is connected to an interconnection formed by a third layer; and wherein, in the vertical transfer register, the interconnection covers a portion of the second and fourth transfer electrodes and is disposed therebetween such that the third transfer electrodes are partially covered by the interconnection and the first transfer electrodes are not covered by the interconnections.

4. A solid-state image pickup device according to claim 3, wherein said first and third transfer electrodes of the first layer are arranged in such a manner as to hold the other of said second and fourth transfer electrodes of the second layer in parallel to each other between said light receiving portions adjacent to each other in the vertical direction; wherein the other of said second and fourth transfer electrodes of the second layer are disposed on said first and third transfer electrodes of the first layer; and wherein said interconnection is formed on said one of said second and fourth transfer electrodes of the second layer.

\* \* \* \* \*